(12) United States Patent
Kaneko (10) Patent No.: US 7,242,704 B2
(45) Date of Patent: Jul. 10, 2007

(54) OPTICAL ELEMENT, AND ITS MANUFACTURING METHOD

(75) Inventor: Tsuyoshi Kaneko, Shinosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 277 days.

(21) Appl. No.: 11/020,121

(22) Filed: Dec. 27, 2004

(65) Prior Publication Data

US 2005/0152423 A1  Jul. 14, 2005

(30) Foreign Application Priority Data

Jan. 8, 2004  (JP) .............................. 2004-003056

(51) Int. Cl.
*H01S 5/00* (2006.01)
(52) U.S. Cl. ................. 372/50.21; 372/50.124
(58) Field of Classification Search ............. 372/50.21, 372/50.124, 46.013, 46.015
See application file for complete search history.

(56) References Cited

U.S. PATENT DOCUMENTS

| 5,606,572 | A | 2/1997 | Swirhun et al. |
|---|---|---|---|
| 5,887,013 | A | 3/1999 | Lee et al. |
| 6,535,538 | B1 | 3/2003 | Lee et al. |
| 2003/0002555 | A1 | 1/2003 | Tran et al. |
| 2003/0021322 | A1 | 1/2003 | Steinle et al. |

FOREIGN PATENT DOCUMENTS

| DE | 198 07 783 A1 | 9/1999 |
|---|---|---|
| EP | 0899 836 A1 | 3/1999 |
| EP | 0 993 087 A1 | 4/2000 |
| EP | 1 009 032 A1 | 6/2000 |
| JP | A-01-061966 | 3/1989 |
| JP | 10-135568 A | 5/1998 |
| JP | 11-004046 A | 1/1999 |
| JP | 2000-183444 A | 6/2000 |
| JP | 2002-033553 A | 1/2002 |
| JP | 2002-504754 A | 2/2002 |
| JP | 2002-208755 A | 7/2002 |

OTHER PUBLICATIONS

Lott, "Design of Vertical Cavity Lasers with Intracavity Photodetectors," *Electronics Letters*, vol. 33, No. 11 May 22, 1997.
Kim et al., "Selective Etching of AlGaAs/GaAs Structures Using the Solutions of Citric Acid/$H_2O_2$ and de-ionized $H_2O$/buffered Oxide Etch," *American Vacuum Society*, vol. 16, No. 2, pp. 558-560, Mar./Apr. 1998.

*Primary Examiner*—Armando Rodriguez
(74) *Attorney, Agent, or Firm*—Oliff & Berridge, PLC (57) ABSTRACT

To provide an optical element including a surface-emitting type semiconductor laser and an photodetector element, which can be processed with a high accuracy, and its manufacturing method. An optical element in accordance with the present invention includes a surface-emitting type semiconductor laser including, above a substrate, a first mirror, an active layer and a second mirror disposed from the side of the substrate, and a photodetector element, provided above the surface-emitting type semiconductor laser, including a first contact layer, a photoabsorption layer and a second contact layer disposed from the side of the surface-emitting type semiconductor laser, wherein an isolation layer is provided between the second mirror and the first contact layer.

21 Claims, 6 Drawing Sheets

OPTICAL ELEMENT, AND ITS MANUFACTURING METHOD

BACKGROUND

The present invention relates to optical elements and methods for manufacturing the same.

A surface-emitting type semiconductor laser has characteristics in which its light output varies depending on ambient temperatures. For this reason, there may be cases where an optical module that uses a surface-emitting type semiconductor laser may be equipped with a photodetector function that detects a part of laser light emitted from the surface-emitting type semiconductor laser to thereby monitor light output values. For example, a photodetector element such as a photodiode or the like may be provided on a surface-emitting type semiconductor laser, such that a part of laser light emitted from the surface-emitting type semiconductor laser can be monitored within the same device (for example, see Patent Document 1).

[Patent Document 1] Japanese Laid-open Patent Application HEI 10-135568

SUMMARY

It is an object of the present invention to provide an optical element including a surface-emitting type semiconductor laser and a photodetector element, which can be processed with a high accuracy, and its manufacturing method.

An optical element in accordance with the present invention includes:

a surface-emitting type semiconductor laser including, above a substrate, a first mirror, an active layer and a second mirror disposed from the side of the substrate; and a photodetector element, provided above the surface-emitting type semiconductor laser, including a first contact layer, a photoabsorption layer and a second contact layer disposed from the side of the surface-emitting type semiconductor laser, wherein an isolation layer is provided between the second mirror and the first contact layer.

In an optical element in accordance with the present invention, the case where another specific element (hereafter referred to as "B") is formed above a specific element (hereafter referred to as "A"), includes a case where B is formed directly on A, and a case where B is formed through another element above A. This similarly applies to a method for manufacturing an optical element in accordance with the present invention.

In the optical element in accordance with the present invention, the isolation layer, an uppermost layer of the second mirror, and the first contact layer may be composed of AlGaAs layers, respectively, wherein an Al composition of the isolation layer may be greater than an Al composition of the uppermost layer of the second mirror, and may be greater than an Al composition of the first contact layer.

In an optical element and its manufacturing method, the Al composition of an AlGaAs layer is a composition of aluminum (Al) to gallium (Ga). In an optical element and its manufacturing method, the Al composition in an AlGaAs layer is from 0 to 1. In other words, an AlGaAs layer includes a GaAs layer (when the Al composition is 0) and an AlAs layer (when the Al composition is 1).

In the optical element in accordance with the present invention, the Al composition of the isolation layer may be 0.3 or greater.

In the optical element in accordance with the present invention, the photoabsorption layer and the second contact layer may be composed of AlGaAs layers, respectively, wherein the Al composition of the isolation layer may be greater than an Al composition of the photoabsorption layer, and may be greater than an Al composition of the second contact layer.

In the optical element in accordance with the present invention, the second mirror may include a current constriction layer that is obtained by oxidizing the AlGaAs layer from a side surface thereof, and the Al composition of the isolation layer may be smaller than an Al composition of the AlGaAs layer for the current constriction layer.

In the optical element in accordance with the present invention, the Al composition of the isolation layer may be less than 0.95.

In the optical element in accordance with the present invention, an optical film thickness of the isolation layer may be an odd multiple of $\lambda/4$, when a design wavelength of the surface-emitting type semiconductor laser is $\lambda$.

In an optical element and its manufacturing method in accordance with the present invention, a design wavelength is a wavelength of light with the maximum strength among light generated in the above-described surface-emitting type semiconductor laser.

Also, in an optical element and its manufacturing method in accordance with the present invention, an optical film thickness is a value obtained by multiplying an actual film thickness of a layer and a refractive index of a material that composes the layer.

In the optical element in accordance with the present invention, a total optical film thickness of the photodetector element may be an odd multiple of $\lambda/4$, when a design wavelength of the surface-emitting type semiconductor laser is $\lambda$.

The optical element in accordance with the present invention may include:

a first electrode electrically connected to the substrate or the first mirror, a second electrode electrically connected to the second mirror, a third electrode electrically connected to the first contact layer, and a fourth electrode electrically connected to the second contact layer, wherein the second electrode and the third electrode may be are electrically connected.

In the optical element in accordance with the present invention, the second mirror may be composed of a p-type semiconductor layer, and the second electrode may include platinum.

In the optical element in accordance with the present invention, the first contact layer may be composed of a p-type semiconductor layer, and the third electrode may include platinum.

A method for manufacturing an optical element in accordance with the present invention pertains to a method for manufacturing an optical element including a surface-emitting type semiconductor laser and a photodetector element, including:

a process of laminating semiconductor layers for forming at least, above the substrate, a first mirror, an active layer, a second mirror, an isolation layer, a first contact layer, a photoabsorption layer and a second contact layer;

a step of forming a second contact layer and a photoabsorption layer by etching the semiconductor layers;

a step of forming a first contact layer by etching the semiconductor layers using a first etchant;

a step of forming the isolation layer by etching the semiconductor layers using a second etchant; and a step of forming a columnar section including at least a part of the second mirror by etching the semiconductor layers, wherein an etching rate of the isolation layer to the first etchant is smaller than an etching rate of the first contact layer to the first etchant, and an etching rate of the isolation layer to the second etching is greater than an etching rate of the uppermost layer of the second mirror to the second etchant.

According to the method for manufacturing an optical element, in the step of etching the first contact layer, the isolation layer exists below the first contact layer, and the isolation layer functions as an etching stopper, such that the etching of the first contact layer can be accurately and readily conducted with a high precision.

According to the method for manufacturing an optical element, in the step of etching the isolation layer, the uppermost layer of the second mirror exists below the isolation layer, and the uppermost layer of the second mirror functions as an etching stopper layer, such that an upper surface of the uppermost layer of the second mirror can be accurately and readily exposed with a high precision.

In the method for manufacturing an optical element in accordance with the present invention, the isolation layer, an uppermost layer of the second mirror, and the first contact layer may be composed of AlGaAs layers, respectively, wherein an Al composition of the isolation layer may be greater than an Al composition of the uppermost layer of the second mirror, and is greater than an Al composition of the first contact layer.

In the method for manufacturing an optical element in accordance with the present invention, the Al composition of the isolation layer may be 0.3 or greater.

In the method for manufacturing an optical element in accordance with the present invention, the photoabsorption layer and the second contact layer may be composed of AlGaAs layers, respectively, wherein the Al composition of the isolation layer may be greater than an Al composition of the photoabsorption layer, and may be greater than an Al composition of the second contact layer.

The method for manufacturing an optical element in accordance with the present invention may include a step of forming a current constriction layer by oxidizing the AlGaAs layer in the second mirror from a side surface thereof, wherein the Al composition of the isolation layer may be smaller than an Al composition of the AlGaAs layer for the current constriction layer.

In the method for manufacturing an optical element in accordance with the present invention, the Al composition of the isolation layer may be less than 0.95.

In the method for manufacturing an optical element in accordance with the present invention, an optical film thickness of the isolation layer may be an odd multiple of $\lambda/4$, when a design wavelength of the surface-emitting type semiconductor laser is $\lambda$.

In the method for manufacturing an optical element in accordance with the present invention, a total optical film thickness of the photodetector element may be an odd multiple of $\lambda/4$, when a design wavelength of the surface-emitting type semiconductor laser is $\lambda$.

The method for manufacturing an optical element in accordance with the present invention, may include:

a step of forming a first electrode electrically connected to the substrate or the first mirror, a step of forming a second electrode electrically connected to the second mirror, a step of forming a third electrode electrically connected to the first contact layer, and a step of forming a fourth electrode electrically connected to the second contact layer, wherein the second electrode and the third electrode may be formed to be electrically connected.

In the method for manufacturing an optical element in accordance with the present invention, the step of forming the first electrode and the step of forming the third electrode may be conducted in the same process, and the step of forming the second electrode and the step of forming the fourth electrode may be conducted in the same process.

In the method for manufacturing an optical element in accordance with the present invention, the second mirror may be composed of a p-type semiconductor layer, and the second electrode may include platinum.

In the method for manufacturing an optical element in accordance with the present invention, the first contact layer may be composed of a p-type semiconductor layer, and the third electrode may include platinum.

DETAILED DESCRIPTION OF EMBODIMENTS

Preferred embodiments of the present invention are described below with reference to the drawings.

1. Structure of Optical Element

Figure 1:
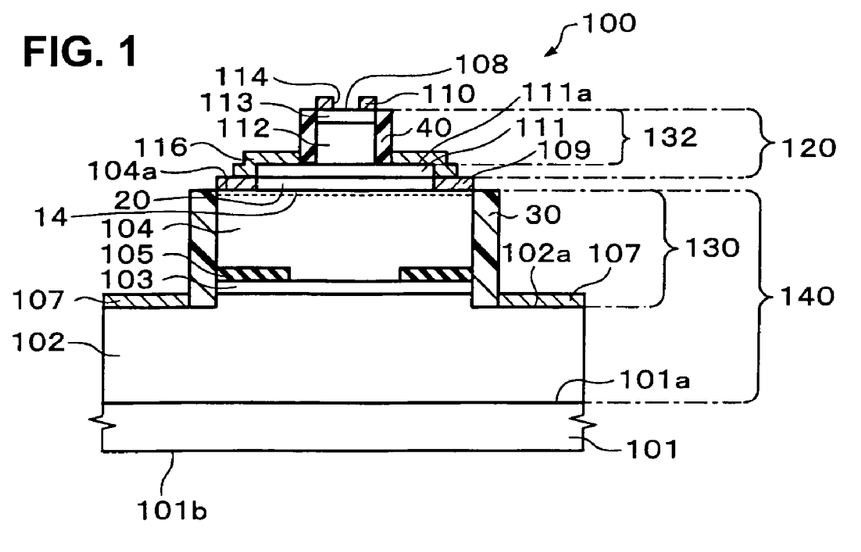
FIG. 1 is a cross-sectional view schematically showing an optical element in accordance with an embodiment.
Figure 2:
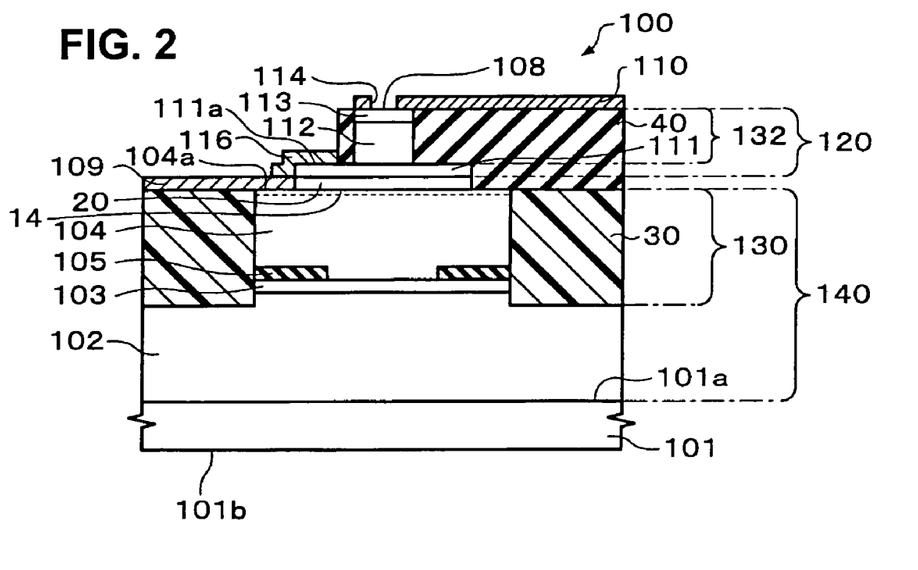
FIG. 2 is a cross-sectional view schematically showing an optical element in accordance with an embodiment.
Figure 3:
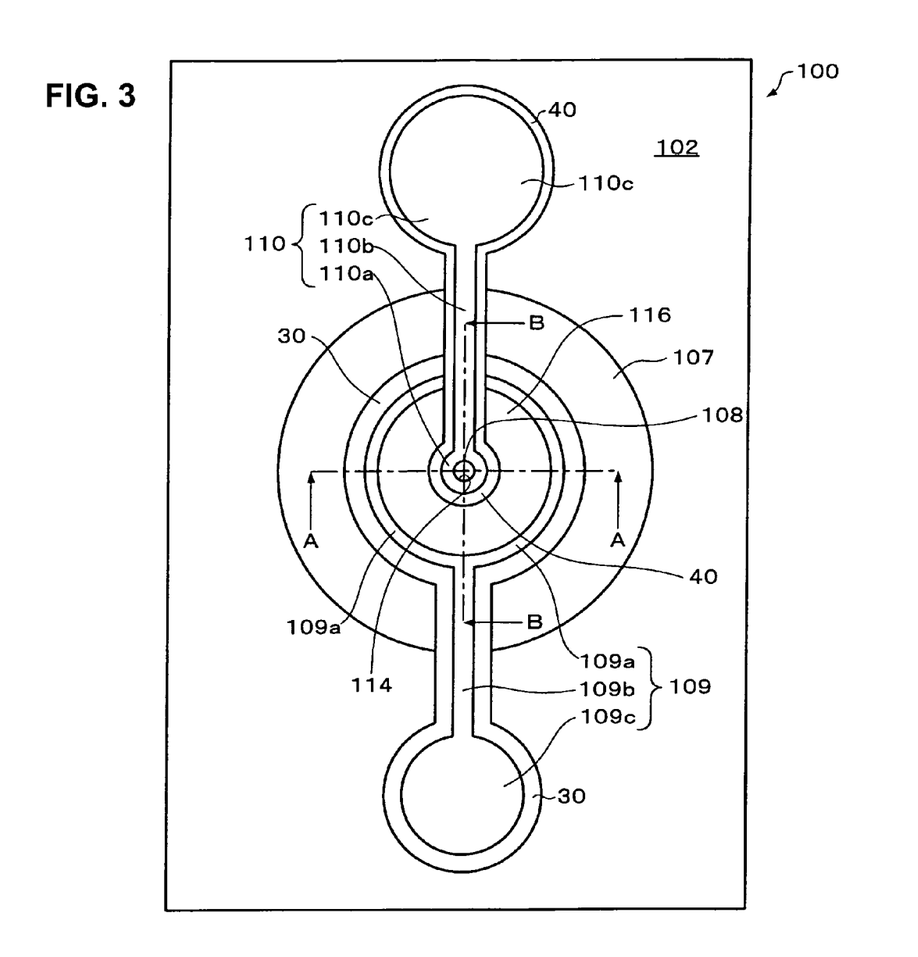
FIG. 3 is a cross-sectional view schematically showing an optical element in accordance with an embodiment.

FIG. 1 and FIG. 2 are cross-sectional views schematically showing an optical element 100 in accordance with an embodiment of the present invention. Also, FIG. 3 is a plan view schematically showing the optical element 100 shown in FIG. 1 and FIG. 2. It is noted that FIG. 1 is a view indicating a cross section taken along a line A—A in FIG. 3, and FIG. 2 is a view indicating a cross section taken along a line B—B in FIG. 3.

The optical element 100 in accordance with the present embodiment, as shown in FIG. 1, includes a surface-emitting type semiconductor laser 140, an isolation layer 20, and a photodetector element 120.

The surface-emitting type semiconductor laser 140, the isolation layer 20, the photodetector element 120, and an overall structure are described below.

1-1. Surface-Emitting Type Semiconductor Laser

The surface-emitting type semiconductor laser 140 is provided on a semiconductor substrate (an n-type GaAs substrate in the present embodiment) 101. The surface-emitting type semiconductor laser 140 includes a vertical resonator. Also, the surface-emitting type semiconductor laser 140 can include a columnar semiconductor deposition body (hereafter referred to as a "columnar section") 130.

The surface-emitting type semiconductor laser 140 is formed from, for example, a distributed reflection type multilayer mirror of 40 pairs of alternately laminated n-type $Al_{0.9}Ga_{0.1}As$ layers and n-type $Al_{0.15}Ga_{0.85}As$ layers (hereafter called a "first mirror") 102, an active layer 103 composed of GaAs well layers and $Al_{0.3}Ga_{0.7}As$ barrier layers in which the well layers include a quantum well structure composed of three layers, and a distributed reflection type multilayer mirror of 25 pairs of alternately laminated p-type $Al_{0.9}Ga_{0.1}As$ layers and p-type $Al_{0.15}Ga_{0.85}As$ layers (hereafter called a "second mirror") 104, which are successively stacked in layers.

An uppermost layer 14 of the second mirror 104 is composed to be a layer with a small Al composition, in other words, a p-type $Al_{0.15}Ga_{0.85}As$ layer. The composition of each of the layers and the number of the layers forming the first mirror 102, the active layer 103 and the second mirror 104 are not limited to the above. It is noted that the Al composition of the uppermost layer 14 of the second mirror 104 may preferably be less than 0.3. The reason for this is described below.

The second mirror 104 is formed to be p-type by, for example, doping carbon (C), and the first mirror 102 is formed to be n-type by, for example, doping silicon (Si). Accordingly, the p-type second mirror 104, the active layer 103 in which no impurity is doped, and the n-type first mirror 102 form a pin diode.

A portion among the surface-emitting type semiconductor laser 140 extending from the second mirror 104 to an intermediate point of the first mirror 102 is etched in a circular shape, as viewed from an upper surface 104a of the second mirror 104, thereby forming a columnar portion 130. It is noted that, in the present embodiment, the columnar portion 130 has a plane configuration that is circular, but its configuration can have any arbitrary configuration.

Also, a first dielectric layer 30 is formed in a manner to surround mainly the columnar section 130. The first dielectric layer 30 is formed on the first mirror 102. Further, the first dielectric layer 30 is formed below a leading section 109b and a pad section 109c of a second electrode 109 to be described below. Moreover, the first dielectric layer 30 is formed below a second dielectric layer 40 to be described below.

A current constricting layer 105, that is obtained by oxidizing the AlGaAs layer from its side surface, is formed in a region near the active layer 103 among layers composing the second mirror 104. The current constricting layer 105 is formed in a ring shape. In other words, the current constricting layer 105 has a cross section, when cut in a plane parallel with a surface 101a of the semiconductor substrate 101 shown in FIG. 1 and FIG. 2, which is a circular ring shape concentric with a circle of the plane configuration of the columnar section 130.

Also, the surface-emitting type semiconductor laser 140 is provided with a first electrode 107 and a second electrode 109. The first electrode 107 and the second electrode 109 are used to drive the surface-emitting type semiconductor laser 140.

More specifically, as shown in FIG. 1, the first electrode 107 is provided on an upper surface 102a of the first mirror 102. The first electrode 107, as shown in FIG. 3, has a plane configuration of a ring shape. In other words, the first electrode 107 is provided in a manner to surround mainly the columnar section 130. Stated otherwise, the columnar section 130 is provided inside the first electrode 107.

The second electrode 109 is provided on an upper surface 104a of the surface-emitting type semiconductor laser 140. The second electrode 109, as shown in FIG. 3, has a connection section 109a having a plane configuration of a ring shape, a leading section 109b having a plane configuration of a linear shape, and a pad section 109c having a circular plane configuration. The second electrode 109 is electrically connected to the second mirror 104 at the connection section 109a. The leading section 109b of the second electrode 109 connects the connection section 109a and the pad section 109c. The pad section 109c of the second electrode can be used as an electrode pad. The connection section 109a of the second electrode 109 is provided in a manner to surround mainly an isolation layer 20 to be described below. In other words, the isolation layer 20 is provided inside the second electrode 109.

It is noted that, although the present embodiment indicates a case where the first electrode 107 is provided on the first mirror 102, the first electrode 107 can be provided on a back surface 101b of the semiconductor substrate 101.

The first electrode 107 is composed of a laminated film of an alloy of gold (Au) and germanium (Ge), and gold (Au), for example. The second electrode 109 is composed of a laminated film of platinum (Pt), titanium (Ti) and gold (Au), for example. Electric current is injected in the active layer 103 by the first electrode 107 and the second electrode 109. It is noted that the materials for forming the first electrode 107 and the second electrode 109 are not limited to those described above, but, for example, an alloy of gold (Au) and zinc (Zn) can be used.

1-2. Isolation Layer

In the optical element 100 of the present embodiment, the isolation layer 20 is formed on the surface-emitting type semiconductor laser 140. In other words, the isolation layer 20 is provided between the surface-emitting type semiconductor laser 140 and a photodetector element 120 to be described below. More specifically, as shown in FIG. 1 and FIG. 2, the isolation layer 20 is formed on the second mirror 104. Namely, the isolation layer 20 is provided between the second mirror 104 and a first contact layer 111 to be described below.

The isolation layer 20 has a circular plane configuration. In the illustrated example, the plane configuration of the isolation layer 20 is the same as the plane configuration of the first contact layer 111. The plane configuration of the isolation layer 20 can be formed to be larger than the plane configuration of the first contact layer 111. The isolation layer 20 will be described in greater detail in conjunction with a method for manufacturing an optical element to be described below.

1-3. Photodetector Element

The photodetector element 120 is provided on the isolation layer 20. In the optical element 100 of the present embodiment, the upper surface of the photodetector element 120 includes an emission surface 108 of laser light.

Also, the photodetector element 120 includes the first contact layer 111, a photoabsorption layer 112, and a second contact layer 113. The first contact layer 111 is provided on the isolation layer 20, the photoabsorption layer 112 is provided on the first contact layer 111, and the second contact layer 113 is provided on the photoabsorption layer 112. The first contact layer 111 has a plane configuration that is formed to be larger than the plane configuration of either the photoabsorption layer 112 or the second contact layer 113 (see FIG. 1 and FIG. 2). The second contact layer 113 and the photoabsorption layer 112 compose a columnar semiconductor stacked body.

The first contact layer 111 may be composed of, for example, an n-type GaAs layer, the photoabsorption layer 112 may be composed of, for example, a GaAs layer with no impurity being introduced, and the second contact layer 113 may be composed of, for example, a p-type GaAs layer. More specifically, the first contact layer 111 is made to be n-type by doping, for example, silicon (Si), and the second contact layer 113 is made to be p-type by doping, for example, carbon (C). Accordingly, the p-type second contact layer 113, the photoabsorption layer 112 without an impurity being doped, and the n-type first contact layer 111 form a pin diode.

The photodetector element 120 is provided with a third electrode 116 and a fourth electrode 110. The third electrode 116 and the fourth electrode 110 are used to drive the photodetector element 120. More specifically, as shown in FIG. 1 and FIG. 2, the third electrode 116 is formed in a manner to cover the first contact layer 111. A part of the third electrode 116 is formed on the above-described second electrode 109. In other words, the third electrode 116 and the second electrode 109 are electrically connected. As shown in FIG. 3, the third electrode 116 has a plane configuration of a ring shape. Namely, the third electrode 116 is provided in a manner to surround mainly the first contact layer 111 and the second dielectric layer 40. Stated otherwise, the first contact layer 111 and the second dielectric layer 40 are provided inside the third electrode 116.

The fourth electrode 110 has, as shown in FIG. 3, a connection section 110a having a plane configuration of a ring shape, a leading section 110b having a plane configuration of a linear shape, and a pad section 110c having a circular plane configuration. The fourth electrode 110 is electrically connected to the second contact layer 113 at the connection section 110a. The leading section 110b of the fourth electrode 110 connects the connection section 110a and the pad section 110c. The pad section 110c of the fourth electrode can be used as an electrode pad. The fourth electrode 110 is provided on an upper surface (on the second contact layer 113) of the photodetector element 120. The fourth electrode 110 is provided with an aperture section 114, and a part of an upper surface of the second contact layer 113 is exposed through the aperture section 114. The exposed surface is the emission surface 108 of laser light. Accordingly, by appropriately setting the plane configuration and the size of the opening section 114, the configuration and the size of the emission surface 108 can be appropriately set. In the present embodiment, as shown in FIG. 3, a case in which the emission surface 108 is in a circular shape is indicated.

Also, in the optical element 100 in accordance with the present embodiment, the third electrode 116 can be formed with the same material as that of the first electrode 107, and the fourth electrode 110 can be formed with the same material as that of the second electrode 109.

Also, the second dielectric layer 40 is formed in a manner to surround mainly the photoabsorption layer 112 and the second contact layer 113. The second dielectric layer 40, as shown in FIG. 1–FIG. 3, is formed over the first contact layer 111, the second mirror 104 and the first dielectric layer 30. Furthermore, the second dielectric layer 40 is formed below the leading section 110b and the pad section 110c of the fourth electrode 110.

1-4. Overall Structure

In the optical element 100 in accordance with the present embodiment, the n-type first mirror 102 and the p-type second mirror 104 of the surface-emitting type semiconductor laser 140, and the n-type first contact layer 111 and the p-type second contact layer 113 of the photodetector element 120 form a npnp structure as a whole.

The photodetector element 120 has a function to monitor outputs of light generated by the surface-emitting type semiconductor laser 140. More specifically, the photodetector element 120 converts light generated by the surface-emitting type semiconductor laser 140 into electric current. With values of the electric current, outputs of light generated by the surface-emitting type semiconductor laser 140 can be detected.

More specifically, in the photodetector element 120, a part of light generated by the surface-emitting type semiconductor laser 140 is absorbed by the photoabsorption layer 112, and photoexcitation is caused by the absorbed light in the photoabsorption layer 112, and electrons and holes are generated. Then, by an electric field that is applied from an outside element, the electrons move to the third electrode 116 and the holes move to the fourth electrode 110, respectively. As a result, a current is generated in the direction from the first contact layer 111 to the second contact layer 113 in the photodetector element 120.

Also, light output of the surface-emitting type semiconductor laser 140 is determined mainly by a bias voltage applied to the surface-emitting type semiconductor laser 140. In particular, light output of the surface-emitting type semiconductor laser 140 greatly changes depending on the ambient temperature of the surface-emitting type semiconductor laser 140 and the service life of the surface-emitting type semiconductor laser 140. For this reason, it is necessary for the surface-emitting type semiconductor laser 140 to maintain a predetermined level of light output.

In the optical element 100 in accordance with the present embodiment, light output of the surface-emitting type semiconductor laser 140 is monitored, and the value of a voltage to be applied to the surface-emitting type semiconductor laser 140 is adjusted based on the value of a current generated by the photodetector element 120, whereby the value of a current flowing within the surface-emitting type semiconductor laser 140 can be adjusted. Accordingly, a predetermined level of light output can be maintained in the surface-emitting type semiconductor laser 140. The control to feed back the light output of the surface-emitting type semiconductor laser 140 to the value of a voltage to be applied to the surface-emitting type semiconductor laser 140 can be performed by using an external electronic circuit (a drive circuit not shown).

2. Operation of Optical Element

General operations of the optical element 100 of the present embodiment are described below. It is noted that the following method for driving the optical element 100 is described as an example, and various changes can be made without departing from the subject matter of the present invention.

When a voltage in a forward direction is applied to the pin diode across the first electrode 107 and the second electrode 109, recombination of electrons and holes occur in the active layer 103 of the surface-emitting type semiconductor laser 140, thereby causing emission of light due to the recombination. Stimulated emission occurs during the period the generated light reciprocates between the second mirror 104 and the first mirror 102, whereby the light intensity is amplified. When the optical gain exceeds the optical loss, laser oscillation occurs, whereby laser light is emitted from the upper surface 104a of the second mirror 104, and enters the isolation layer 20. Next, the laser light enters the first contact layer 111 of the photodetector element 120.

Then, in the photodetector element 120, the light entered the first contact layer 111 then enters the photoabsorption layer 112. As a result of a part of the incident light being absorbed by the photoabsorption layer 112, photoexcitation is caused in the photoabsorption layer 112, and electrons and holes are generated. Then, by an electric field that is applied from an outside element, the electrons move to the third electrode 116 and the holes move to the fourth electrode 110, respectively. As a result, a current (photoelectric current) is generated in the direction from the first contact layer 111 to the second contact layer 113 in the photodetector element 120. By measuring the value of the current, light output of the surface-emitting type semiconductor laser 140 can be detected.

3. Method for Manufacturing Optical Element

Next, one example of a method for manufacturing the optical element 100 in accordance with an embodiment of the present invention is described, using FIG. 4–FIG. 13. FIG. 4–FIG. 13 are cross-sectional views schematically showing a process of manufacturing the optical element 100 shown in FIG. 1–FIG. 3, and correspond to the cross-sectional view shown in FIG. 1, respectively.

Figure 4:
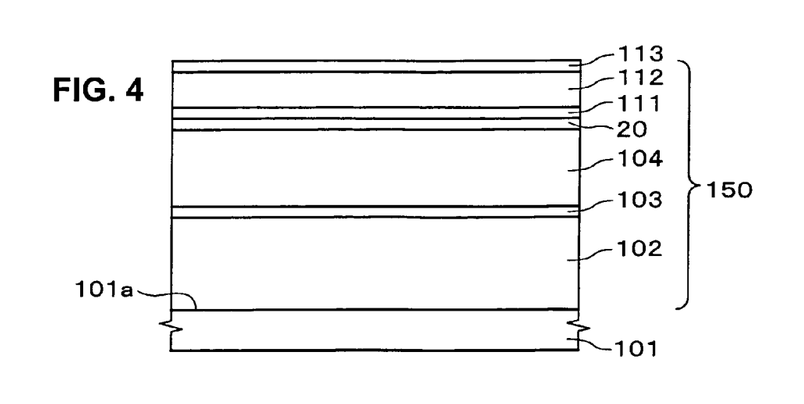
FIG. 4 is a cross-sectional view schematically showing a method for manufacturing an optical element in accordance with an embodiment.

(1) First, on a surface 101a of a semiconductor substrate 101 composed of an n-type GaAs layer, a semiconductor multilayer film 150 shown in FIG. 4 is formed by epitaxial growth while modifying its composition. It is noted here that the semiconductor multilayer film 150 is formed from, for example, a first mirror 102 of 40 pairs of alternately laminated n-type $Al_{0.9}Ga_{0.1}As$ layers and n-type $Al_{0.15}Ga_{0.85}As$ layers, an active layer 103 composed of GaAs well layers and $Al0.3Ga0.7As$ barrier layers in which the well layers include a quantum well structure composed of three layers, a second mirror 104 of 25 pairs of alternately laminated p-type $Al_{0.9}Ga_{0.1}As$ layers and p-type $Al_{0.15}Ga_{0.85}As$ layers, an isolation layer 20 composed of an AlGaAs layer without impurities being doped, a first contact layer 111 composed of an n-type GaAs layer, a photoabsorption layer 112 composed of a GaAs layer without impurities being doped, and a second contact layer 113 composed of a p-type GaAs layer. These layers are successively stacked in layers on the semiconductor substrate 101, thereby forming the semiconductor multilayer film 150. It is noted that the isolation layer 20 can be composed of a p-type or n-type AlGaAs layer.

The isolation layer 20 whose etching rate to a second etchant to be described below is greater than an etching rate of an uppermost layer 14 of the second mirror 104 to the second etchant can be used. More specifically, for example, the isolation layer 20 can be composed of an AlGaAs layer having an Al composition that is greater than an Al composition of the uppermost layer 14 of the second mirror 104. In other words, when the second mirror 104 is grown, the uppermost layer 14 of the second mirror 104 is formed to become an AlGaAs layer having an Al composition smaller than the Al composition of the isolation layer 20. More specifically, the uppermost layer 14 of the second mirror 104 and the isolation layer 20 may preferably be formed such that the Al composition of the uppermost layer 14 of the second mirror 104 is less than 0.3, and the Al composition of the isolation layer 20 is 0.3 or greater.

The isolation layer 20 whose etching rate to a first etchant to be described below is smaller than an etching rate of the first contact layer 111 to the first etchant can be used. More specifically, for example, the isolation layer 20 can be composed of an AlGaAs layer having an Al composition that is greater than an Al composition of the first contact layer 111. In other words, when the first contact layer 111 is grown, the first contact layer 111 is formed to become an AlGaAs layer (including a GaAs layer) having an Al composition smaller than the Al composition of the isolation layer. More specifically, the first contact layer 111 and the isolation layer 20 may preferably be formed such that the Al composition of the first contact layer 111 is less than 0.3, and the Al composition of the isolation layer 20 is 0.3 or greater.

It is noted that, when the second mirror 104 is grown, at least one layer thereof near the active layer 103 is formed to be a layer that is later oxidized and becomes a current constricting layer 105 (see FIG. 9). More specifically, the layer that becomes the current constricting layer 105 is formed to be an AlGaAs layer (including an AlAs layer) having an Al composition that is greater than an Al composition of the isolation layer 20. In other words, the isolation layer 20 can be formed to be an AlGaAs layer whose Al composition is smaller than that of the layer that becomes to be the current constricting layer 105. By this, in an oxidizing process (see FIG. 9) for forming the current constricting layer 105 to be described below, the isolation layer 20 cannot be oxidized. More specifically, the layer that becomes to be the current constricting layer 105 and the isolation layer 20 may preferably be formed such that the Al composition of the layer that becomes to be the current constricting layer 105 is 0.95 or greater, and the Al composition of the isolation layer 20 is less than 0.95.

An optical film thickness of the isolation layer 20 can be, for example, an odd multiple of $\lambda/4$, when a design wavelength of the surface-emitting type semiconductor laser 140 (see FIG. 1 and FIG. 2) is $\lambda$.

Also, the sum of optical film thickness of the first contact layer 111, the photoabsorption layer 112 and the second contact layer 113, in other words, the optical film thickness of the entire photodetector element 120 (see FIG. 1 and FIG. 2), can be, for example, an odd multiple of $\lambda/4$. As a result, the entire photodetector element 120 can function as a distributed reflection type mirror. In other words, the entire photodetector element 120 can function as a distributed reflection type mirror above the active layer 103 in the surface-emitting type semiconductor laser 140. Accordingly, the photodetector element 120 can function as a distributed reflection type mirror without adversely affecting the characteristics of the surface-emitting type semiconductor laser 140.

Also, when a second electrode 109 is formed in a later step, at least a portion of the second mirror 104 near an area contacting the second electrode 109 may preferably be formed with a high carrier density such that ohmic contact can be readily made with the second electrode 109. Similarly, at least a portion of the first contact layer 111 near an area contacting the third electrode 116 may preferably be formed with a high carrier density such that ohmic contact can be readily made with the third electrode 116.

The temperature at which the epitaxial growth is conducted is appropriately decided depending on the growth method, the kind of raw material, the type of the semiconductor substrate 101, and the kind, thickness and carrier density of the semiconductor multilayer film 150 to be formed, and in general may preferably be 450° C.–800° C. Also, the time required for conducting the epitaxial growth is appropriately decided like the temperature. Also, a metal-organic chemical vapor deposition (MOVPE: Metal-Organic Vapor Phase Epitaxy) method, a MBE method (Molecular Beam Epitaxy) method or a LPE (Liquid Phase Epitaxy) method can be used as a method for the epitaxial growth.

Figure 5:
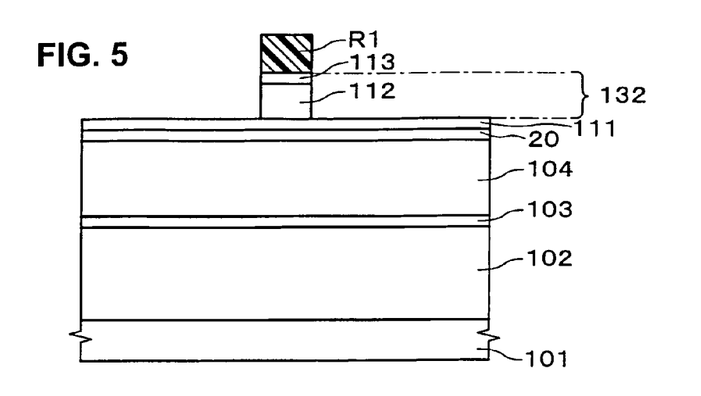
FIG. 5 is a cross-sectional view schematically showing the method for manufacturing an optical element in accordance with the embodiment.

(2) Next, the second contact layer 113 and the photoabsorption layer 112 are patterned into a specified configuration (see FIG. 5).

First, resist (not shown) is coated on the semiconductor multilayer film 150, and then the resist is patterned by a lithography method, thereby forming a resist layer R1 having a specified pattern.

Then, by using the resist layer R1 as a mask, the second contact layer 113 and the photoabsorption layer 112 are etched by, for example, a dry etching method. By this, the second contact layer 113 and the photoabsorption layer 112 having the same plane configuration as that of the second contact layer 113 are formed. The second contact layer 113 and the photoabsorption layer 112 form a pillar-shaped semiconductor deposited body. Then, the resist layer R1 is removed.

Figure 6:
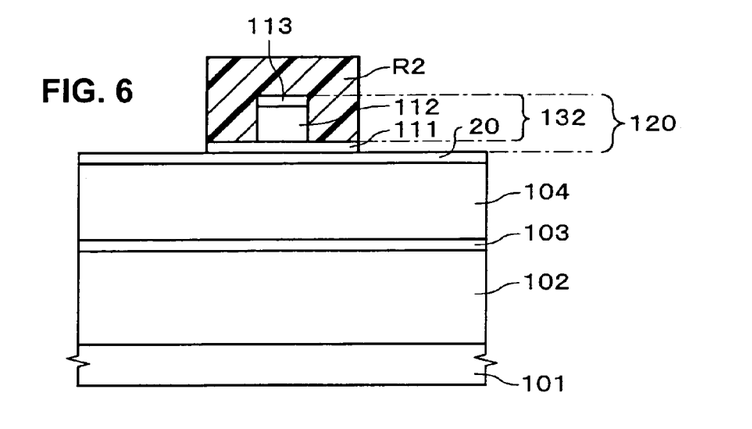
FIG. 6 is a cross-sectional view schematically showing the method for manufacturing an optical element in accordance with the embodiment.

(3) Then, the first contact layer 111 is patterned into a specified pattern (see FIG. 6). More specifically, first, resist (not shown) is coated on the first contact layer 111, and then the resist is patterned by a lithography method, thereby forming a resist layer R2 having a specified pattern.

Then, by using the resist layer R2 as a mask, the first contact layer 111 is etched with a first etchant. In this instance, because the isolation layer 20 is disposed below the first contact layer 111, and the isolation layer 20 functions as an etching stopper layer, etching of the first contact layer 111 can be accurately and readily stopped at the time when the isolation layer 20 is exposed. More specifically, the following is conducted.

As described above, the isolation layer 20 having an etching rate to the first etchant that is smaller than an etching rate of the first contact layer 111 to the first etchant can be used. In other words, initially, the first contact layer 111 is etched at a greater etching rate until the isolation layer 20 is exposed. Then, the isolation layer 20 is exposed.

The etching rate of the isolation layer 20 is smaller than the etching rate of the first contact layer 111. In other words, the isolation layer 20 is more difficult to be etched compared to the first contact layer 11. Accordingly, at the time when the isolation layer 20 is exposed, etching with the first etchant becomes difficult to take place, and therefore it is easy to stop etching at this point of time. In other words, etching of the first contact layer 111 can be accurately and readily stopped at the time when the isolation layer 20 is exposed.

More specifically, for example, the isolation layer 20 can be composed of an AlGaAs layer having an Al composition greater than the Al composition of the first contact layer 111. Then, the first etchant can be selected such that the etching rate of the AlGaAs layer having a large Al composition is small, and the etching rate of the AlGaAs layer having a small Al composition is large. In other words, the first etchant that selectively etches the AlGaAs layer having a small Al composition can be selected. By this, the etching rate of the isolation layer 20 to the first etchant can be made smaller than the etching rate of the first contact layer 111 to the first etchant.

As described above, the Al composition of the isolation layer 20 is preferably 0.3 or greater, and the Al composition of the first contact layer 111 is preferably less than 0.3. In this case, a mixed solution of ammonia, hydrogen peroxide and water can be used as the first etchant. For example, the mixing ratio of ammonia, hydrogen peroxide and water that is about 1:10:150 can be used, but this mixing ratio is not particularly limited, and can be appropriately decided.

As a result, as shown in FIG. 6, the photodetector element 120 is formed. The photodetector element 120 includes the second contact layer 113, the photoabsorption layer 112 and the first contact layer 111. Also, the plane configuration of the first contact layer 111 may be formed to be greater than the plane configuration of the second contact layer 113 and the photoabsorption layer 112.

In the process described above, the case where after the second contact layer 111 and the photoabsorption layer 112 are patterned, the first contact layer 111 is patterned is described. However, after the first contact layer 111 may be patterned, and then the second contact layer 111 and the photoabsorption layer 112 may be patterned.

Figure 7:
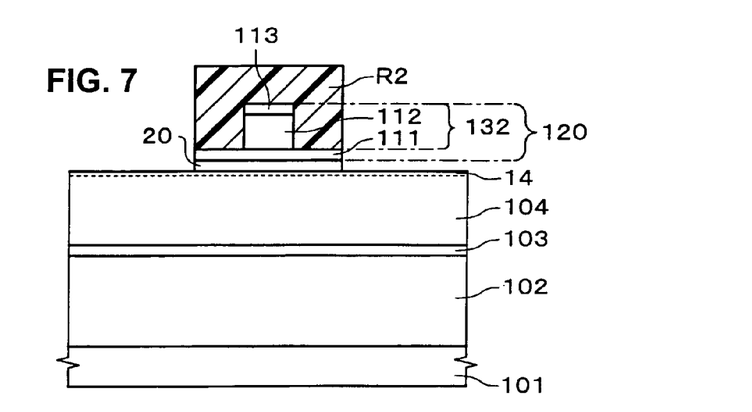
FIG. 7 is a cross-sectional view schematically showing the method for manufacturing an optical element in accordance with the embodiment.

(4) Next, the isolation layer 20 is patterned into a specified pattern (see FIG. 7). More specifically, using the aforementioned resist R2 as a mask, the isolation layer 20 is etched with a second etchant. In this instance, because the uppermost layer 14 of the second mirror 104 is disposed below the isolation layer 20, and the uppermost layer 14 of the second mirror 104 functions as an etching stopper layer, etching of the isolation layer 20 can be accurately and readily stopped at the time when the uppermost layer 14 of the second mirror 104 is exposed. More specifically, the following is conducted.

As described above, the isolation layer 20 having an etching rate to the second etchant that is greater than an etching rate of the uppermost layer 14 of the second mirror 104 to the second etchant can be used. In other words, initially, the isolation layer 20 is etched at a greater etching rate until the uppermost layer 14 of the second mirror 104 is exposed. Then, the uppermost layer 14 of the second mirror 104 is exposed.

The etching rate of the uppermost layer 14 of the second mirror 104 is smaller than the etching rate of the isolation layer 20. In other words, the uppermost layer 14 of the second mirror 104 is more difficult to be etched compared to the isolation layer 20. Accordingly, at the time when the uppermost layer 14 of the second mirror 104 is exposed, etching with the second etchant becomes difficult to take place, and therefore it is easy to stop etching at this point of time. In other words, etching of the isolation layer 20 can be accurately and readily stopped at the time when the uppermost layer 14 of the second mirror 104 is exposed.

More specifically, for example, the isolation layer 20 can be composed of an AlGaAs layer having an Al composition greater than the Al composition of the uppermost layer 14 of the second mirror 104. Then, the second etchant can be selected such that the etching rate of the AlGaAs layer having a large Al composition is large, and the etching rate of the AlGaAs layer having a small Al composition is small. In other words, the second etchant that selectively etches the AlGaAs layer having a large Al composition can be selected. By this, the etching rate of the isolation layer 20 to the second etchant can be made greater than the etching rate of the uppermost layer 14 of the second mirror 104 to the second etchant.

As described above, the Al composition of the isolation layer 20 is preferably 0.3 or greater, and the Al composition of the uppermost layer 14 of the second mirror 104 is preferably less than 0.3. In this case, for example, hydrofluoric acid can be used as the second etchant. The concentration of the hydrofluoric acid may be about 0.1%, for example, but the concentration of the hydrofluoric acid is not particularly limited, and can be appropriately decided.

As a result, as shown in FIG. 7, the isolation layer 20 that is patterned is formed. Then, the resist layer R2 is removed. In the illustrated example, the plane configuration of the isolation layer 20 is formed to be the same as the plane configuration of the first contact layer 111. But the plane configuration of the isolation layer 20 can be formed to be greater than the plane configuration of the first contact layer 111. More specifically, instead of the resist layer R2 that is used for patterning the isolation layer 20 described above, another resist layer having a plane configuration greater than that of the resist layer R2 may be used to pattern the isolation layer 20.

Figure 8:
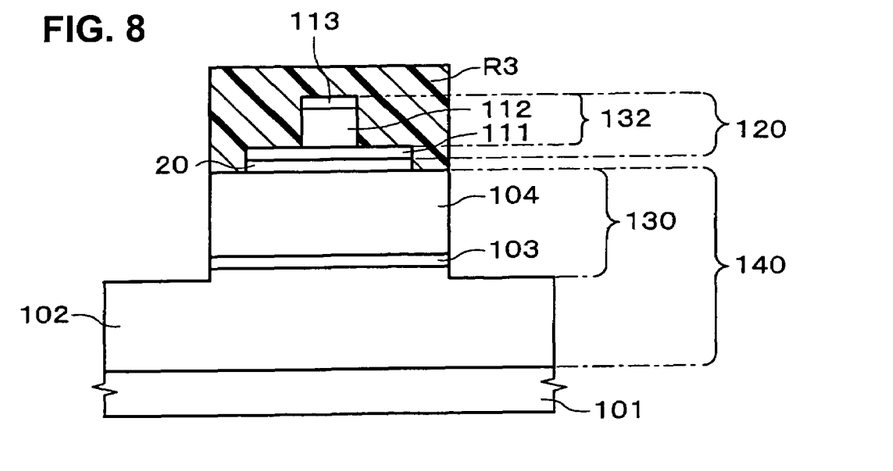
FIG. 8 is a cross-sectional view schematically showing the method for manufacturing an optical element in accordance with the embodiment.

(5) Next, by patterning, a surface-emitting type semiconductor laser 140 including a columnar section 130 is formed (see FIG. 8). More specifically, first, resist (not shown) is coated on the second mirror 104, and then the resist is patterned by a lithography method, thereby forming a resist layer R3 having a specified pattern. Then, by using the resist layer R3 as a mask, the second mirror 104, the active layer 103 and a part of the first mirror 102 are etched by, for example, a dry etching method. By this, as shown in FIG. 8, the columnar section 130 is formed.

By the process described above, a vertical resonator including the columnar section 130 (surface-emitting type semiconductor laser 140) is formed on the semiconductor substrate 101. In other words, a laminated body of the surface-emitting type semiconductor laser 140, the isolation layer 20 and the photodetector element 120 is formed. Then, the resist layer R3 is removed.

In the present embodiment, as described above, the case where the photodetector element 120 and the isolation layer 20 are first formed, and then the columnar section 130 is formed is described. However, the columnar section 130 may be formed first, and then the photodetector element 120 and the isolation layer 20 may be formed.

Figure 9:
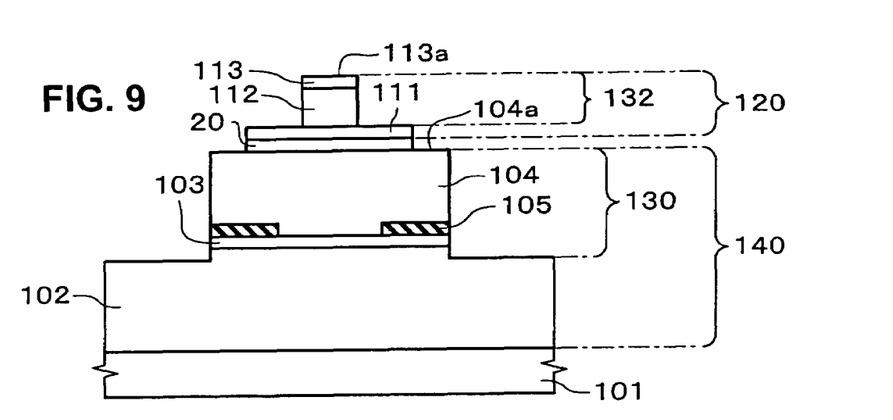
FIG. 9 is a cross-sectional view schematically showing the method for manufacturing an optical element in accordance with the embodiment.

Next, by placing the semiconductor substrate 101 on which the columnar section 130 is formed through the aforementioned steps in a water vapor atmosphere at about 400° C., for example, a layer having a high Al composition provided in the second mirror 104 is oxidized from its side surface, thereby forming a current constricting layer 105 (see FIG. 9). As described above, in this step, it is possible that the isolation layer 20 is not oxidized.

The oxidation rate depends on the temperature of the furnace, the amount of water vapor supply, and the Al composition and the film thickness of the layer to be oxidized. In a surface-emitting type laser equipped with a current constricting layer that is formed by oxidation, a current flows only in a portion where the current constricting layer is not formed (a portion that is not oxidized). Accordingly, in the process for forming the current constricting layer by oxidation, the range of the current constricting layer 105 to be formed may be controlled, whereby the current density can be controlled.

Also, the diameter of the current constricting layer 105 may preferably be adjusted such that a major portion of light that is emitted from the surface-emitting type semiconductor laser 140 enters the first contact layer 111.

Figure 10:
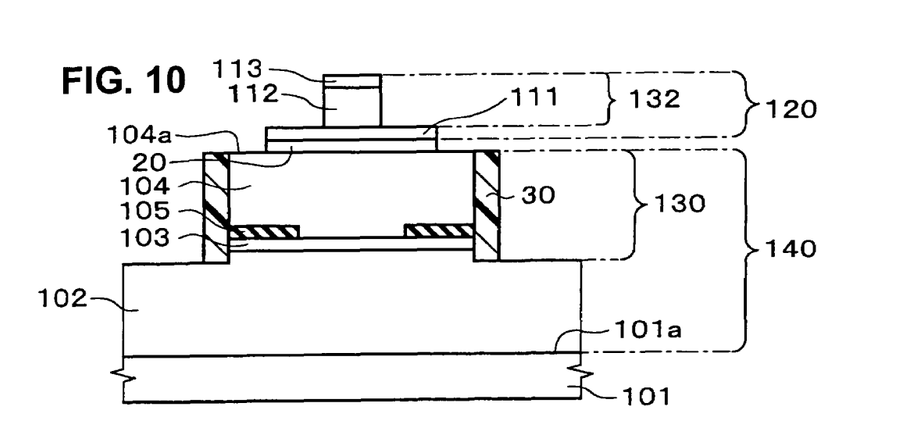
FIG. 10 is a cross-sectional view schematically showing the method for manufacturing an optical element in accordance with the embodiment.

(7) Next, as shown in FIG. 10, a first dielectric layer 30 is formed on the first mirror 102, around the columnar section 130. The first dielectric layer 30 may use material that is easier to make a thick film compared to a second dielectric layer 40. For example, the first dielectric layer 30 can use material that is obtained by hardening liquid material settable by energy, such as, heat, light or the like (for example, a precursor of ultraviolet setting type resin or thermosetting type resin). As the ultraviolet setting type resin, for example, an acrylic resin, an epoxy resin or the like that is an ultraviolet setting type can be enumerated. Also, as the thermosetting type resin, a polyimide resin or the like that is a thermosetting type can be enumerated.

Here, the case where a precursor of polyimide resin is used as the material for forming the first dielectric layer 30 is described. First, for example, by using a spin coat method, the precursor (precursor of polyimide resin) is coated on the semiconductor substrate 101, thereby forming a precursor layer. It is noted that, as the method for forming the precursor layer, besides the aforementioned spin coat method, another known technique, such as, a dipping method, a spray coat method, an ink jet method or the like can be used.

Then, the semiconductor substrate 101 is heated by using, for example, a hot plate or the like, thereby removing the solvent, and then is placed in a furnace at about 350° C. to thereby imidize the precursor layer, thereby forming a polyimide resin layer that is almost perfectly set. Then, as shown in FIG. 10, the polyimide resin layer is patterned by using a known lithography technique, thereby forming the first dielectric layer 30. As the etching method used for patterning, a dry etching method or the like can be used. Dry etching can be conducted with, for example, oxygen or argon plasma.

In the method for forming the first dielectric layer 30 described above, an example is presented in which a precursor layer of polyimide resin is set, and then patterning is conducted. However, patterning may be conducted before the precursor layer of polyimide resin is set. As the etching method used for this patterning, a wet etching method or the like can be used. The wet etching can be conducted with, for example, an alkaline solution or an organic solution.

Figure 11:
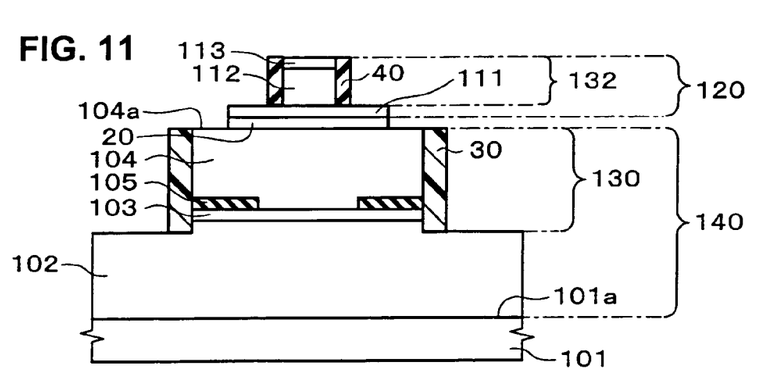
FIG. 11 is a cross-sectional view schematically showing the method for manufacturing an optical element in accordance with the embodiment.

(8) Next, as shown in FIG. 11, a second dielectric layer 40 is formed on the first contact layer 111, around the photoabsorption layer 112 and the second contact layer 113. The second dielectric layer 40 can use material that is easy to perform micro processing compared with the first dielectric layer 30. For example, as the second dielectric layer 40, an inorganic dielectric film such as a silicon oxide film, a silicon nitride film, or the like can be used. Specifically, the method for forming the second dielectric layer 40 is conducted as follows.

First, a dielectric layer (not shown) is formed over the entire surface of the semiconductor substrate 101 on which the surface-emitting type semiconductor laser 140 and the photodetector element 120 are formed. This dielectric layer can be formed by, for example, a plasma CVD. Next, by using a known lithography technique, the dielectric layer is patterned, thereby forming a second dielectric layer 40. The second dielectric layer 40 can be patterned more finely compared to the first dielectric layer 30 as described above. As the etching method used for this patterning, a dry etching method or a wet etching method can be used. The dry etching can be conducted with plasma including fluorine radical, for example. The wet etching can be conducted with hydrofluoric acid, for example.

Figure 12:
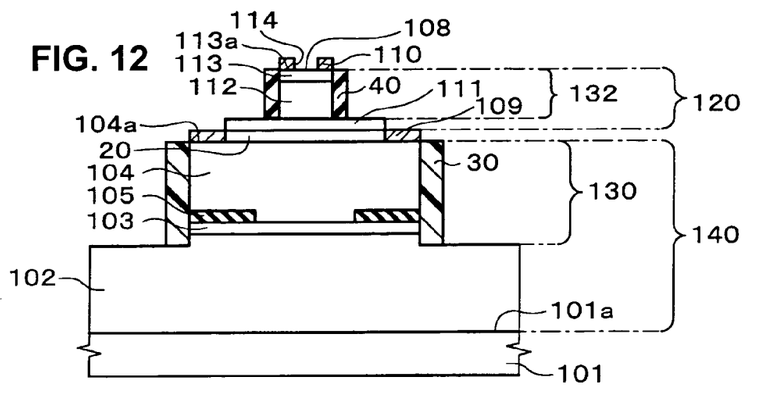
FIG. 12 is a cross-sectional view schematically showing the method for manufacturing an optical element in accordance with the embodiment.

(9) Then, a second electrode 109 is formed on an upper surface 104a of the second mirror 104, and a fourth electrode 110 is formed on an upper surface of the photodetector element 120 (an upper surface 113a of the second contact layer 113) (see FIG. 12).

First, before the second electrode 109 and the fourth electrode 110 are formed, the upper surface 104a of the second mirror 104 and the upper surface 113a of the second contact layer 113 are washed by using a plasma processing method or the like, depending on the necessity. As a result, an element with more stable characteristics can be formed.

Next, a laminated film (not shown) of platinum (Pt), titanium (Ti), and gold (Au), for example, is formed by, for example, a vacuum deposition method. Then, the second electrode 109 and the fourth electrode 110 are formed by removing the laminated film other than specified positions by a lift-off method. In this instance, a portion where the above-mentioned laminated film is not formed is formed on the upper surface 113a of the second contact layer 113. This portion becomes an opening section 114, and a portion of the upper surface 113a of the second contact layer 113 is exposed through the opening section 114. The exposed surface becomes an emission surface 108 of laser light.

As described above, the second electrode 109 can include at least platinum (Pt). The second electrode 109 can use an alloy of gold (Au) and zinc (Zn), for example. Most preferably, the second electrode 109 includes platinum. The reason is as follows.

It the optical element 100 in accordance with the present embodiment, the second electrode 109 contacts the p-type second mirror 104 (see FIG. 1 and FIG. 2). If the second electrode 109 includes zinc (Zn), it is possible that zinc may diffuse in the p-type second mirror 104 in an anneal processing step to be described below, since zinc thermally diffuses in an amount greater than that of platinum, and may reach the adjacent n-type first contact layer 111. Because zinc is a p-type dopant in the first contact layer 111 that is composed of a GaAs layer, it may change the n-type first contact layer 111 to p-type. As a result, the pin structure in the photodetector element 120 may be destroyed. In contrast, platinum has a smaller thermal diffusion amount compared to zinc, and therefore the n-type first contact layer 111 can be prevented from being changed to p-type.

It is noted that a dry etching method or a wet etching method can be used in the above-described process instead of the lift-off method. Also, in the process described above, a sputter method can be used instead of the vapor deposition method. Further, in the process described above, although the second electrode 109 and the fourth electrode 110 are patterned at the same time, the second electrode 109 and the fourth electrode 110 can be formed individually.

Figure 13:
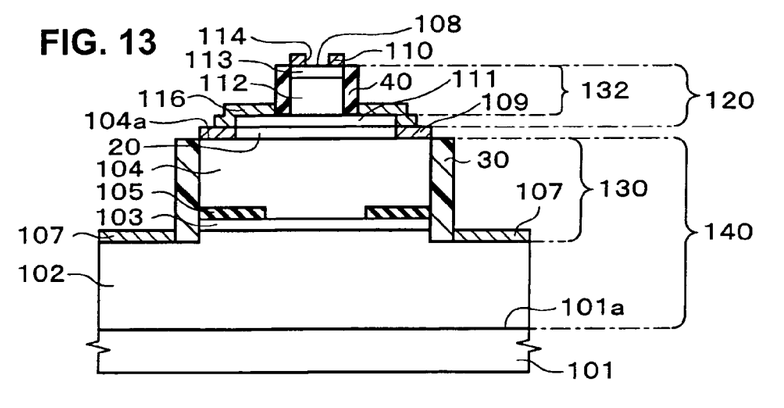
FIG. 13 is a cross-sectional view schematically showing the method for manufacturing an optical element in accordance with the embodiment.

(10) Next, by a similar method, a laminated film of an alloy of gold (Au) and germanium (Ge), and gold (Au) is patterned, whereby a first electrode 107 is formed on the first mirror 102 of the surface-emitting type semiconductor laser 140, and a third electrode 116 is formed on the first contact layer 111 of the photodetector element 120 (see FIG. 13). The first electrode 107 and the third electrode 116 can be patterned and formed at the same time, or the first electrode 107 and the third electrode 116 may be formed individually.

(11) Next, an annealing treatment is conducted. The temperature of the annealing treatment depends on the electrode material. This is usually conducted at about 400° C. for the electrode material used in the present embodiment. The first–fourth electrodes 107, 109, 110, 116 are formed with the process described above.

By the process described above, as indicated in FIG. 1–FIG. 3, the optical element 100 in accordance with the present embodiment can be obtained.

4. Actions and Effects

The optical element 100 and its manufacturing method in accordance with the present embodiment have actions and effects as follows.

According to the method for manufacturing the optical element 100 in accordance with the present embodiment, in the step for etching the first contact layer 111, the isolation layer 20 exists below the first contact layer 111, and the isolation layer 20 functions as an etching stopper, such that the etching of the first contact layer 111 can be accurately and readily conducted with a high precision.

According to the optical element 100 in accordance with the present embodiment, the Al composition of the first contact layer 111 is smaller than the Al composition of the isolation layer 20. Therefore, because the Al composition of the first contact layer 111 can be made smaller, ohmic contact between the first contact layer 111 and the third electrode 116 can be readily obtained. As described above, the Al composition of the first contact layer 111 may preferably be less than 0.3. Because the Al composition of the first contact layer 111 is less than 0.3, better ohmic contact can be obtained between the first contact layer 111 and the third electrode 116.

According to the method for manufacturing the optical element 100 in accordance with the present embodiment, in the step of etching the isolation layer 20, the uppermost layer 14 of the second mirror 104 exists below the isolation layer 20, and the uppermost layer 14 of the second mirror 104 functions as an etching stopper layer, such that an upper surface of the uppermost layer 14 of the second mirror 104 is can be accurately and readily exposed with a high precision.

According to the optical element 100 in accordance with the present embodiment, the Al composition of the uppermost layer 14 of the second mirror 104 is smaller than the Al composition of the isolation layer 20. Therefore, because the Al composition of the uppermost layer 14 of the second mirror 104 can be made smaller, ohmic contact between the uppermost layer 14 of the second mirror 104 and the second electrode 109 can be readily obtained. As described above, the Al composition of the uppermost layer 14 of the second mirror 104 may preferably be less than 0.3. Because the Al composition of the uppermost layer 14 of the second mirror 104 is less than 0.3, better ohmic contact can be obtained between the uppermost layer 14 of the second mirror 104 and the second electrode 109.

According to the optical element 100 in accordance with the present embodiment, the Al composition of the isolation layer 20 is greater than the Al composition of the uppermost layer 14 of the second mirror 104, and is greater than the Al composition of the first contact layer 111. Stated otherwise, on the uppermost layer 14 of the second mirror 104 is formed the isolation layer 20 having the Al composition that is greater than the Al composition of the uppermost layer 14 of the second mirror 104. Also, on the isolation layer 20 is formed the first contact layer 111 having the Al composition that is smaller than the Al composition of the isolation layer 20. By laminating layers having different Al compositions in this manner, the laminated film (the uppermost layer 14 of the second mirror 104, the isolation layer 20, and the first contact layer 111) can be used as a mirror. In other words, the isolation layer 20 and the first contact layer 111 can be used as a mirror without adversely affecting the characteristics of the surface-emitting type-semiconductor laser 140, and the degree of freedom in device design can be improved.

According to the optical element 100 in accordance with the present embodiment, an optical film thickness of the isolation layer 20 is made to be an odd multiple of $\lambda/4$, such that the isolation layer 20 can function as a distributed reflection type mirror. In other words, the second mirror 104 and the isolation layer 20 in the surface-emitting type semiconductor laser 140 can function as a distributed reflection type mirror above the active layer 103. Accordingly, the isolation layer 20 can function as a distributed reflection type mirror without adversely affecting the characteristics of the surface-emitting type semiconductor laser 140.

According to the optical element 100 in accordance with the present embodiment, the first dielectric layer 30 is formed around the columnar section 130. The first dielectric layer 30 can be readily formed into a thick film compared to the second dielectric layer 40. By forming the first dielectric layer 30 thick, the parasitic capacitance in the surface-emitting type semiconductor laser 140 can be reduced. As a result, a high-speed driving of the surface-emitting type semiconductor laser 140 becomes possible.

According to the optical element 100 in accordance with the present embodiment, the second dielectric layer 40 is formed around the photoabsorption layer 112 and the second contact layer 113. The second dielectric layer 40 is easy to be micro-processed compared to the first dielectric layer 30. By finely processing the second dielectric layer 40, an electrode having a minute and complex structure in the photodetector element 120 can be insulated.

According to the method for manufacturing the optical element 100 in accordance with the present embodiment, the step of forming the first dielectric layer 30 and the step of forming the second dielectric layer 40 are independently conducted. For this reason, the optical element 100 having the first dielectric layer 30 and the second dielectric layer 40 that achieve the aforementioned actions and effects can be formed.

According to the optical element 100 in accordance with the present embodiment, the isolation layer 20 can be formed without being oxidized. In other words, in the oxidation step for forming the current constricting layer 105 in the method for manufacturing the optical element 100 in accordance with the present embodiment, the isolation layer 20 can be formed without being oxidized. Because the isolation layer 20 is not oxidized, reduction in the strength due to oxidation can be prevented. Also, because the isolation layer 20 is not oxidized, reduction in the index of refraction due to oxidation can be prevented. As a result, the reflecting power of the isolation layer 20 when functioning as a mirror can be prevented from being adversely affected.

According to the optical element 100 in accordance with the present embodiment, because a portion of light output of the surface-emitting type semiconductor laser 140 is monitored by the photodetector element 120 and fed back to the driving circuit, output fluctuations due to temperatures or the like can be corrected, and therefore stable light outputs can be obtained.

Figure 14:
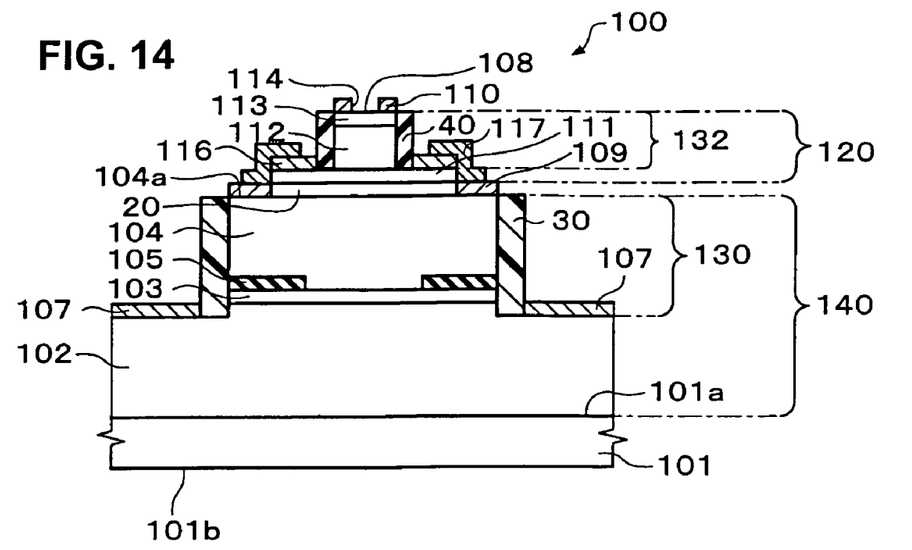
FIG. 14 is a cross-sectional view schematically showing an optical element in accordance with an embodiment.

Preferred embodiments of the present invention are described above, but the present invention is not limited to them, and various modes can be made. For example, as shown in FIG. 14, the second electrode 109 and the third electrode 116 can be connected by using a connection electrode 117. More specifically, the connection electrode 117 contacts an upper surface of the second electrode 109, and contacts an upper surface and a side surface of the third electrode 116. As the connection electrode 117, for example, gold can be used, but without being particularly limited, a known metal, alloy, or a laminated film of them can be used. It is noted that FIG. 14 corresponds to a cross-sectional view shown in FIG. 1.

Figure 15:
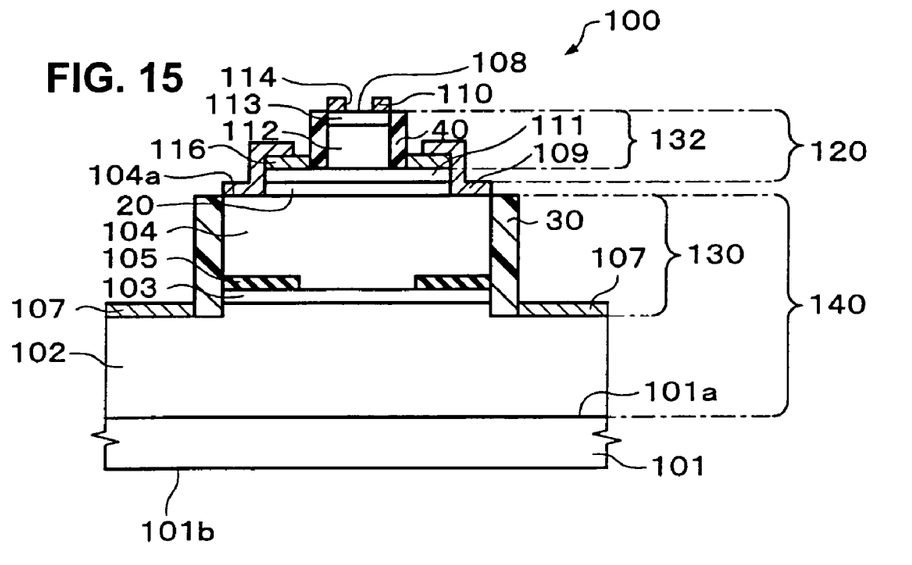
FIG. 15 is a cross-sectional view schematically showing an optical element in accordance with an embodiment.

Also, in the embodiment described above, an example in which the third electrode 116 is formed to cover a portion of the upper surface of the second electrode 109 is described. However, as shown in FIG. 15, the second electrode 109 can be formed to cover a portion of the upper surface and the side surface of the third electrode 116. It is noted that FIG. 15 corresponds to a cross-sectional view shown in FIG. 1.

Also, for example, interchanging the p-type and n-type of each of the semiconductor layers in the above described embodiments does not deviate from the subject matter of the present invention. In this case, the p-type first mirror 102 and the n-type second mirror 104 of the surface-emitting type semiconductor laser 140, and the p-type first contact layer 111 and the n-type second contact layer 113 of the photodetector element 120 can form a pnpn structure as a whole. In this case, the materials of the second electrode 109 and the third electrode 116 described above can be interchanged. In other word, more specifically, the second electrode 109 that contacts the n-type second mirror 104 can use a laminated film of an alloy of gold (Au) and germanium (Ge) and gold (Au), and the third electrode 116 that contacts the p-type first contact layer 111 can use the one including platinum (Pt).

Also, in the embodiment described above, an example is described in which the first dielectric layer 30 and the second dielectric layer 40 are formed independently with different materials, but they can be formed with the same material at the same time.

What is claimed is:
1. An optical element comprising:
a surface-emitting type semiconductor laser including, above a substrate, a first mirror, an active layer and a second mirror disposed from the side of the substrate; and
a photodetector element, that is provided above the surface-emitting type semiconductor laser, including a first contact layer, a photoabsorption layer and a second contact layer disposed from the side of the surface-emitting type semiconductor laser,
an isolation layer that is provided between the second mirror and the first contact layer;
wherein the isolation layer is composed of an AlGaAs layer and
the second mirror includes a current constriction layer that is obtained by oxidizing the AlGaAs layer from a side surface thereof, and Al composition of the isolation layer is smaller than Al composition of the AlGaAs layer for the current constriction layer.

2. An optical element according to claim 1, wherein
the isolation layer, an uppermost layer of the second mirror, and the first contact layer are composed of AlGaAs layers, respectively,
wherein Al composition in the isolation layer is greater than Al composition of the uppermost layer of the second mirror, and is greater than Al composition of the first contact layer.

3. An optical element according to claim 2, wherein the Al composition of the isolation layer is 0.3 or greater.

4. An optical element comprising:
a surface-emitting type semiconductor laser including, above a substrate, a first mirror, an active layer and a second mirror disposed from the side of the substrate;
a photodetector element, that is provided above the surface-emitting type semiconductor laser, including a first contact layer, a photoabsorption layer and a second contact layer disposed from the side of the surface-emitting type semiconductor laser,
wherein the photoabsorption layer and the second contact layer are composed of AlGaAs layers, respectively,
wherein Al composition of the isolation layer is greater than Al composition of the photoabsorption layer, and is greater than Al composition of the second contact layer; and
an isolation layer that is provided between the second mirror and the first contact layer,
wherein the isolation layer, an uppermost layer of the second mirror, and the first contact layer are composed of AlGaAs layers, respectively,
wherein Al composition in the isolation layer is greater than Al composition of the uppermost layer of the second mirror, and is greater than Al composition of the first contact layer.

5. An optical element according to claim 2, wherein the Al composition of the isolation layer is less than 0.95.

6. An optical element according to claim 1, wherein an optical film thickness of the isolation layer is an odd multiple of $\lambda/4$, when a design wavelength of the surface-emitting type semiconductor laser is $\lambda$.

7. An optical element according to claim 1, wherein a total optical film thickness of the photodetector element is an odd multiple of $\lambda/4$, when a design wavelength of the surface-emitting type semiconductor laser is $\lambda$.

8. An optical element according to claim 1, comprising
a first electrode electrically connected to the substrate or the first mirror,
a second electrode electrically connected to the second mirror,
a third electrode electrically connected to the second electrode and the first contact layer, and
a fourth electrode electrically connected to the second contact layer.

9. An optical element according to claim 8, wherein
the second mirror is composed of a p-type semiconductor layer, and the second electrode includes platinum.

10. An optical element according to claim 8, wherein
the first contact layer is composed of a p-type semiconductor layer, and the third electrode includes platinum.

11. In a method for manufacturing an optical element including a surface-emitting type semiconductor laser and a photodetector element, the method for manufacturing an optical element comprising:
a process of laminating semiconductor layers for forming at least, above the substrate, a first mirror, an active layer, a second mirror, an isolation layer, a first contact layer, a photoabsorption layer and a second contact layer;
a step of forming a second contact layer and a photoabsorption layer by etching the semiconductor layers;
a step of forming a first contact layer by etching the semiconductor layers using a first etchant;
a step of forming the isolation layer by etching the semiconductor layers using a second etchant, wherein the isolation layer is composed of an AlGaAs layer;
a step of forming a current constriction layer by oxidizing the AlGaAs layer in the second mirror from a side surface thereof,
wherein the Al composition of the isolation layer is smaller than Al composition of the AlGaAs layer for the current constriction layer; and
a step of forming a columnar section including at least a part of the second mirror by etching the semiconductor layers,
wherein an etching rate of the isolation layer to the first etchant is smaller than an etching rate of the first contact layer to the first etchant, and
an etching rate of the isolation layer to the second etching is greater than an etching rate of the uppermost layer of the second mirror to the second etchant.

12. A method for manufacturing an optical element according to claim 11,
wherein the isolation layer, an uppermost layer of the second mirror, and the first contact layer are composed of AlGaAs layers, respectively,
wherein an Al composition of the isolation layer is greater than an Al composition of the uppermost layer of the second mirror, and is greater than an Al composition of the first contact layer.

13. A method for manufacturing an optical element according to claim 12, wherein the Al composition of the isolation layer is 0.3 or greater.

14. In a method for manufacturing an optical element including a surface-emitting type semiconductor laser and a photodetector element, the method for manufacturing an optical element comprising:
a process of laminating semiconductor layers for forming at least, above the substrate, a first mirror, an active layer, a second mirror, an isolation layer, a first contact layer, a photoabsorption layer and a second contact layer;
a step of forming a second contact layer and a photoabsorption layer by etching the semiconductor layers, wherein the photoabsorption layer and the second contact layer are composed of AlGaAs layers, respectively,
wherein the Al composition of the isolation layer is greater than an Al composition of the photoabsorption layer, and is greater than an Al composition of the second contact layer;
a step of forming a first contact layer by etching the semiconductor layers using a first etchant;
a step of forming the isolation layer by etching the semiconductor layers using a second etchant, wherein the isolation layer, an uppermost layer of the second mirror, and the first contact layer are composed of AlGaAs layers, respectively,
wherein an Al composition of the isolation layer is greater than an Al composition of the uppermost layer of the second mirror, and is greater than an Al composition of the first contact layer; and a step of forming a columnar section including at least a part of the second mirror by etching the semiconductor layers, wherein an etching rate of the isolation layer to the first etchant is smaller than an etching rate of the first contact layer to the first etchant, and an etching rate of the isolation layer to the second etching is greater than an etching rate of the uppermost layer of the second mirror to the second etchant.

15. A method for manufacturing an optical element according to claim 12, wherein the Al composition of the isolation layer is less than 0.95.

16. A method for manufacturing an optical element according to claim 11, wherein an optical film thickness of the isolation layer is an odd multiple of $\lambda/4$, when a design wavelength of the surface-emitting type semiconductor laser is $\lambda$.

17. A method for manufacturing an optical element according to claim 11, wherein a total optical film thickness of the photodetector element is an odd multiple of $\lambda/4$, when a design wavelength of the surface-emitting type semiconductor laser is $\lambda$.

18. A method for manufacturing an optical element according to claim 10, comprising:

a step of forming a first electrode electrically connected to the substrate or the first mirror, a step of forming a second electrode electrically connected to the second mirror, a step of forming a third electrode electrically connected to the first contact layer, and a step of forming a fourth electrode electrically connected to the second contact layer, wherein the second electrode and the third electrode are formed to be electrically connected.

19. A method for manufacturing an optical element according to claim 18, wherein the step of forming the first electrode and the step of forming the third electrode are conducted in the same process, and the step of forming the second electrode and the step of forming the fourth electrode are conducted in the same process.

20. A method for manufacturing an optical element according to claim 18, wherein the second mirror is composed of a p-type semiconductor layer, and the second electrode includes platinum.

21. A method for manufacturing an optical element according to claim 18, wherein the first contact layer is composed of a p-type semiconductor layer, and the third electrode includes platinum.

* * * * *